(12) United States Patent
Sumi et al.

(10) Patent No.: US 11,715,649 B2
(45) Date of Patent: Aug. 1, 2023

(54) SUBSTRATE PROCESSING APPARATUS

(71) Applicant: SCREEN Holdings Co., Ltd., Kyoto (JP)

(72) Inventors: Noritake Sumi, Kyoto (JP); Masayuki Orisaka, Kyoto (JP)

(73) Assignee: SCREEN Holdings Co., Ltd.

( * ) Notice: Subject to any disclaimer, the term of this patent is extended or adjusted under 35 U.S.C. 154(b) by 182 days.

(21) Appl. No.: 17/219,933

(22) Filed: Apr. 1, 2021

(65) Prior Publication Data
US 2021/0313199 A1    Oct. 7, 2021

(30) Foreign Application Priority Data

Apr. 2, 2020    (JP) ................... 2020-066517

(51) Int. Cl.
*H01L 21/67* (2006.01)
*B08B 7/00* (2006.01)

(52) U.S. Cl.
CPC ...... *H01L 21/67051* (2013.01); *B08B 7/0021* (2013.01)

(58) Field of Classification Search
CPC ........... H01L 21/67051; H01L 21/6704; H01L 21/6719
See application file for complete search history.

(56) References Cited

U.S. PATENT DOCUMENTS

| | | | |
|---|---|---|---|
| 2006/0213436 A1 | 9/2006 | Ohmi et al. | 118/715 |
| 2011/0000507 A1 | 1/2011 | Toshima et al. | 134/19 |
| 2012/0266925 A1 | 10/2012 | Nakashima et al. | 134/200 |
| 2015/0275357 A1 | 10/2015 | Kamakura et al. | |
| 2018/0138035 A1 | 5/2018 | Ohno et al. | |
| 2018/0138060 A1* | 5/2018 | Okamura | H01L 21/6719 |
| 2019/0148182 A1 | 5/2019 | Yamada et al. | |

FOREIGN PATENT DOCUMENTS

| | | |
|---|---|---|
| JP | 2018-082043 A | 5/2018 |
| KR | 10-1069567 B1 | 10/2011 |
| KR | 10-2015-0111812 A | 10/2015 |
| KR | 10-2018-0125763 A | 11/2018 |
| TW | 201250911 A | 12/2012 |

OTHER PUBLICATIONS

Office Action dated Sep. 8, 2021 for the corresponding Taiwanese Patent Application No. 110111721.
Notice of Allowance dated Dec. 29, 2022 for corresponding Korean Patent Application No. 10-2021-0042605.

\* cited by examiner

*Primary Examiner* — Michael E Barr
*Assistant Examiner* — Samuel Robert Barker
(74) *Attorney, Agent, or Firm* — Ostrolenk Faber LLP (57) ABSTRACT

A processing fluid flows into a processing space SP by way of a flow passage and discharge openings 174, 178 having substantially the same cross-sectional shape as that of a gap space formed in a clearance between a wall surface of the processing space SP and a substrate holder 15. On the other hand, the processing fluid having passed through the processing space SP is discharged to an outside via discharge flow passages 183, 187 after flowing into the buffer space 182, 186 having substantially the same width as the gap space. From these, the processing fluid can be caused to flow into the buffer space 182, 186 while the laminar flow state is maintained in the gap space. Thus, the generation of a turbulence in the processing space SP can be suppressed.

14 Claims, 6 Drawing Sheets

FIG. 6B  COMPARATIVE EXAMPLE

SUBSTRATE PROCESSING APPARATUS

CROSS REFERENCE TO RELATED APPLICATION

The disclosure of Japanese Patent Application No. 2020-066517 filed on Apr. 2, 2020 including specification, drawings and claims is incorporated herein by reference in its entirety.

BACKGROUND OF THE INVENTION

1. Field of the Invention

This invention relates to a substrate processing apparatus for processing a substrate by a processing fluid in a chamber.

2. Description of the Related Art

A processing process of various substrates such as semiconductor substrates and glass substrates for display device includes processing the surface of the substrate by various processing fluids. Processes using liquids such as chemical liquids and rinse liquids as the processing fluids have been conventionally widely performed. In recent years, processes using supercritical fluids have been also put to practice. Particularly, in a process of a substrate having a fine pattern formed on a surface, a supercritical fluid having a lower surface tension than a liquid enters deep into clearances of the pattern. Thus, the process can be efficiently performed and an occurrence risk of pattern collapse due to a surface tension during drying can be reduced.

For example, a substrate processing apparatus for performing a process of drying a substrate using a supercritical fluid is described in JP 2018-082043A. In this apparatus, a processing container is configured in which two plate-like members are arranged to face each other and a clearance therebetween functions as a processing space. A wafer (substrate) placed on a thin holding plate is carried in from one end part of the processing space, and carbon dioxide in a supercritical state is introduced from the other end part.

The processing container used in this type of process is one type of a high-pressure chamber. The chamber is provided with an aperture for taking in and out the substrate, and the processing space is formed by closing this aperture by a lid part. An elastic sealing member, for example, made of rubber is interposed between the chamber and the lid part, whereby the airtightness of the processing space is maintained.

SUMMARY OF INVENTION

In the above conventional technique, how a processing fluid flows in the chamber is not mentioned in detail. However, according to the knowledge of the inventors of this application, it was found that how the processing fluid flowed in the chamber affected the quality of a process result, i.e. the cleanliness of the substrate after the process. That is, if there is a turbulence in the flow of the processing fluid in the chamber, impurities generated, for example, from a sealing member may adhere to the substrate to contaminate the substrate.

This invention was developed in view of the above problem and an object thereof is to provide a technique capable of effectively preventing the contamination of a substrate by impurities and enabling a process to be satisfactorily performed in a substrate processing apparatus for processing the substrate by a processing fluid in a chamber.

One aspect of this invention is directed to a substrate processing apparatus for processing a surface of a substrate by a processing fluid, the substrate processing apparatus including, to achieve the above object, a substrate holder in the form of a flat plate, the substrate being placeable in a horizontal posture on an upper surface of the substrate holder; and a chamber including a processing space capable of accommodating the substrate holder having the substrate placed thereon and a side surface having an aperture that communicates with the processing space and allows the substrate holder to pass through, wherein the chamber is provided with an introduction flow passage communicating with the processing space so as to receive the processing fluid supplied from outside the chamber, a buffer space communicating with the processing space and discharge flow passages configured to discharge the processing fluid from the buffer space to the outside of the chamber.

Here, the introduction flow passage is connected to a discharge opening open to a gap space formed in a clearance between a wall surface of the processing space and the substrate holder in one end part of the processing space in a plan view, and a shape of the discharge opening and a cross-sectional shape of a flow passage leading to the discharge opening are substantially the same as a cross-sectional shape of the gap space, the buffer space is connected to the processing space at another end part opposite to the one end part across the substrate in a plan view and has a width substantially equal to that of the gap space in a width direction orthogonal to a flowing direction of the processing fluid flowing from the one end part toward the other end part, and the discharge flow passages are respectively connected to a pair of openings provided in both end parts in the width direction of the buffer space.

In the invention thus configured, out of the processing space, a space except a part occupied by the substrate and the substrate holder, i.e. the gap space formed in the clearance between the wall surface of the processing space and the substrate holder, functions as a flow passage in which the processing fluid flows. In the introduction flow passage for introducing the processing fluid into the processing space, the processing fluid flows into the processing space by way of the flow passage and the discharge opening having substantially the same cross-sectional shape as that of the gap space. Thus, a laminar flow formed in the flow passage on a side upstream of the discharge opening flows into the processing space while maintaining a state thereof.

On the other hand, the processing fluid having passed through the processing space is discharged to the outside via the discharge flow passages after flowing into the buffer space having substantially the same width as the gap space. Although described in detail later, the retention of the processing fluid in the buffer space can be prevented by setting the positions of the discharge flow passages connected to the buffer space in the both end parts of the buffer space in the width direction. There is also an effect of suppressing the generation of components flowing toward a widthwise central side in the flow of the processing fluid in the gap space. From these, the processing fluid can be caused to flow into the buffer space while the laminar flow state is maintained in the gap space.

As just described, by configuring the flow passage to maintain the laminar flow in one direction in the flow of the processing fluid from the introduction flow passage to the buffer space by way of the processing space, the generation of a turbulence in the processing space can be suppressed. A turbulence in the processing space causes liquid components liberated from the substrate and other impurities to adhere to the substrate and contaminate the substrate. However, the contamination of the substrate can be prevented by suppressing the generation of the turbulence.

As described above, in the invention, the processing fluid can be caused to flow as a laminar flow having a substantially constant cross-sectional shape from the introduction flow passage on a side upstream of the processing space to the buffer space on the downstream side in the flowing direction of the processing fluid. Thus, the generation of a turbulence in the processing space can be suppressed and the adhesion of impurities to the substrate due to the turbulence can be prevented.

All of a plurality of constituent elements of each aspect of the invention described above are not essential and some of the plurality of constituent elements can be appropriately changed, deleted, replaced by other new constituent elements or have limited contents partially deleted in order to solve some or all of the aforementioned problems or to achieve some or all of effects described in this specification. Further, some or all of technical features included in one aspect of the invention described above can be combined with some or all of technical features included in another aspect of the invention described above to obtain one independent form of the invention in order to solve some or all of the aforementioned problems or to achieve some or all of the effects described in this specification.

DETAILED DESCRIPTION OF THE PREFERRED EMBODIMENTS

Figure 1:
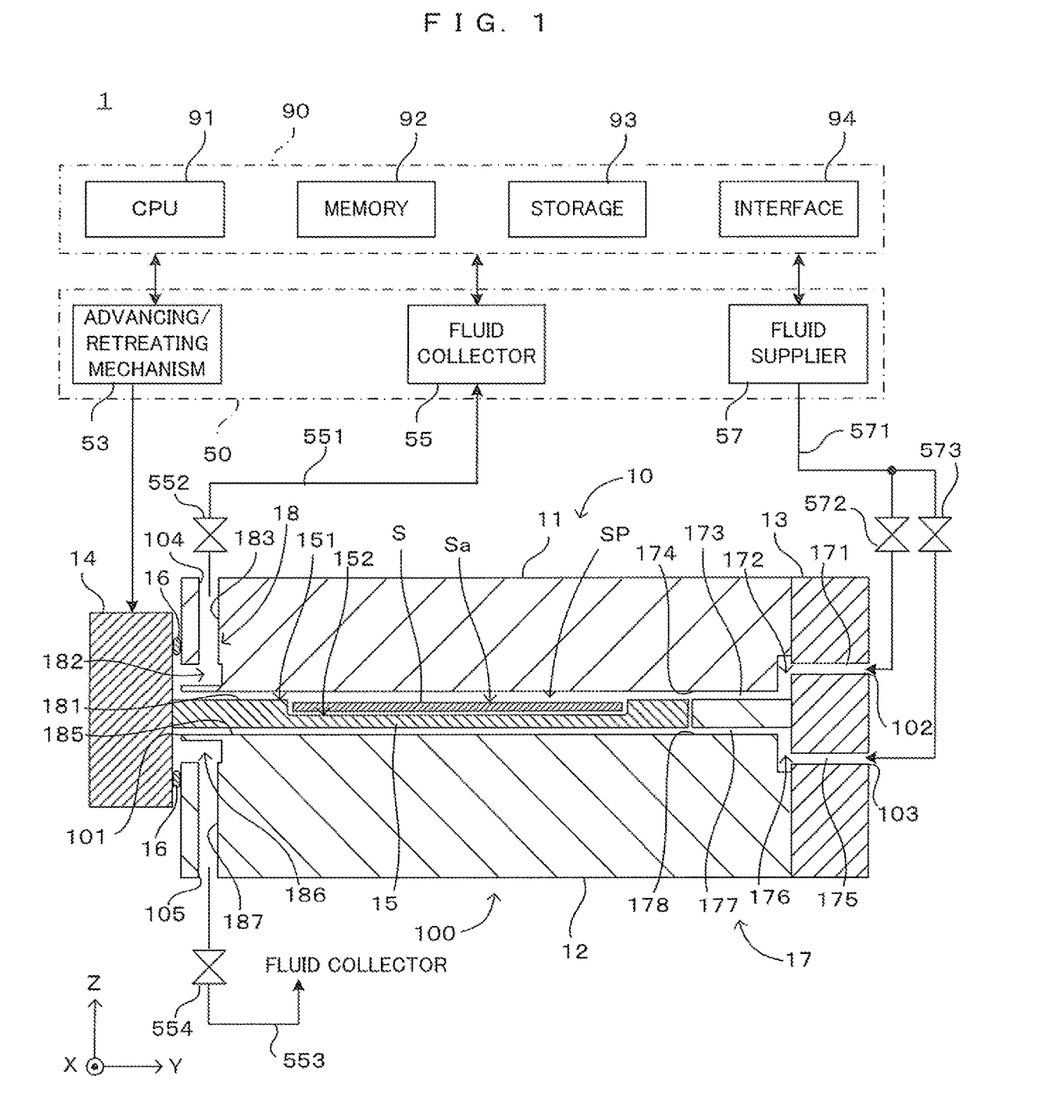
FIG. 1 is a view showing a schematic configuration of one embodiment of a substrate processing apparatus according to the invention.

FIG. 1 is a view showing a schematic configuration of one embodiment of a substrate processing apparatus according to the invention. This substrate processing apparatus 1 is an apparatus for processing surfaces of various substrates such as semiconductor substrates using supercritical fluids. To show directions in each figure in a unified manner below, an XYZ orthogonal coordinate system is set as shown in FIG. 1. Here, an XY plane represents a horizontal plane and a Z direction represents a vertical direction. More specifically, a (−Z) direction represents a vertically downward direction.

Here, various substrates such as semiconductor wafers, glass substrates for photomask, glass substrates for liquid crystal display, glass substrates for plasma display, substrates for FED (Field Emission Display), substrates for optical disk, substrates for magnetic disk, substrates for magneto-optical disk can be adopted as the "substrate" in this embodiment. A substrate processing apparatus used to process a semiconductor wafer is mainly described as an example with reference to the drawings, but the substrate processing apparatus can be adopted also to process various substrates illustrated above.

The substrate processing apparatus 1 includes a processing unit 10, a supply unit 50 and a control unit 90. The processing unit 10 serves as an execution subject of a supercritical drying process, and the supply unit 50 supplies chemical substances and power necessary for the process to the processing unit 10.

The control unit 90 realizes a predetermined process by controlling these components of the apparatus. For this purpose, the control unit 90 includes a CPU 91 for executing various control programs, a memory 92 for temporarily storing processing data, a storage 93 for storing the control programs to be executed by the CPU 91, an interface 94 for information exchange with a user and an external apparatus, and the like. Operations of the apparatus to be described later are realized by the CPU 91 causing each component of the apparatus to perform a predetermined operation by executing the control program written in the storage 93 in advance.

The processing unit 10 includes a processing chamber 100. The processing chamber 100 includes a first member 11, a second member 12 and a third member 13 each formed by a metal block. The first and second members 11, 12 are vertically joined by an unillustrated joining member, and the third member 13 is joined to (+Y) side surfaces of the first and second members 11, 12 by an unillustrated joining member, whereby the processing chamber 100 structured to be hollow inside is configured. This hollow internal space serves as a processing space SP in which the substrate S is processed. A substrate S to be processed is carried into the processing space SP to be processed. A slit-like aperture 101 elongated in an X direction is formed in a (−Y) side surface of the processing chamber 100, and the processing space SP communicates with an outside space via the aperture 101.

A lid part 14 is provided on the (−Y) side surface of the processing chamber 100 to close the aperture 101. A support tray 15 in the form of a flat plate is attached in a horizontal posture to a (+Y) side surface of the lid part 14, and the upper surface of the support tray 15 serves as a support surface on which the substrate S can be placed. More specifically, the support tray 15 is structured such that a recess 152 formed to be slightly larger than a planar size of the substrate S is provided in a substantially flat upper surface 151. The substrate S is accommodated into this recess 152, thereby being held at a predetermined position on the support tray 15. The substrate S is held with a surface Sa to be processed (hereinafter, may be simply referred to as a "substrate surface") faced up. At this time, the upper surface 151 of the support tray 15 and the substrate surface Sa are preferably coplanar.

The lid part 14 is supported horizontally movably in a Y direction by an unillustrated support mechanism. The lid part 14 is movable toward and away from the processing chamber 100 by an advancing/retreating mechanism 53 provided in the supply unit 50. Specifically, the advancing/retreating mechanism 53 includes a linear mechanism such as a linear motor, a linear guide, a ball-screw mechanism, a solenoid or an air cylinder, and such a linear mechanism moves the lid part 14 in the Y direction. The advancing/retreating mechanism 53 operates in response to a control command from the control unit 90.

If the support tray 15 is pulled out from the processing space SP to outside via the aperture 101 by a movement of the lid part 14 in a (−Y) direction, the support tray 15 is accessible from outside. Specifically, it becomes possible to place the substrate S on the support tray 15 and take out the substrate S placed on the support tray 15. On the other hand, the lid part 14 moves in a (+Y) direction, whereby the support tray 15 is accommodated into the processing space SP. If the substrate S is placed on the support tray 15, the substrate S is carried into the processing space SP together with the support tray 15.

In the supercritical drying process mainly aimed to dry a substrate while preventing pattern collapse due to a surface tension of a liquid, the substrate S is carried in with the surface Sa covered by a liquid film to prevent the occurrence of pattern collapse due to the exposed surface Sa. An organic solvent having a relatively low surface tension such as isopropyl alcohol (IPA) or acetone can be preferably used as a liquid constituting the liquid film.

The lid part 14 moves in the (+Y) direction to close the aperture 101, whereby the processing space SP is sealed. A sealing member 16 is provided between the (+Y) side surface of the lid part 14 and the (−Y) side surface of the processing chamber 100 to maintain an airtight state of the processing space SP. An annular member made of an elastic resin material such as rubber can be used as the sealing member 16. Further, the lid part 14 is fixed to the processing chamber 100 by an unillustrated lock mechanism. The substrate S is processed in the processing space SP with the airtight state of the processing space SP ensured in this way.

In this embodiment, a fluid of a substance usable for a supercritical process, e.g. carbon dioxide, is supplied in a gaseous or liquid state to the processing unit 10 from a fluid supplier 57 provided in the supply unit 50. Carbon dioxide enters a supercritical state at relatively low temperature and low pressure and is a chemical substance suitable for the supercritical drying process in having a property of dissolving an organic solvent often used in substrate processing well.

More specifically, the fluid supplier 57 outputs a fluid in a supercritical state or a fluid, which enters the supercritical state retroactively by being supplied in a gaseous or liquid state and having predetermined temperature and pressure applied thereto, as the processing fluid for processing the substrate S. For example, carbon dioxide in the gaseous or liquid state is output in a pressurized state. The fluid is fed under pressure to input ports 102, 103 provided in the (+Y) side surface of the processing chamber 100 via a piping 571 and valves 572, 573 disposed at intermediate positions of the piping 571. That is, the fluid is fed from the fluid supplier 57 to the processing chamber 100 by opening the valves 572, 573 in response to a control command from the control unit 90.

Figure 2A:
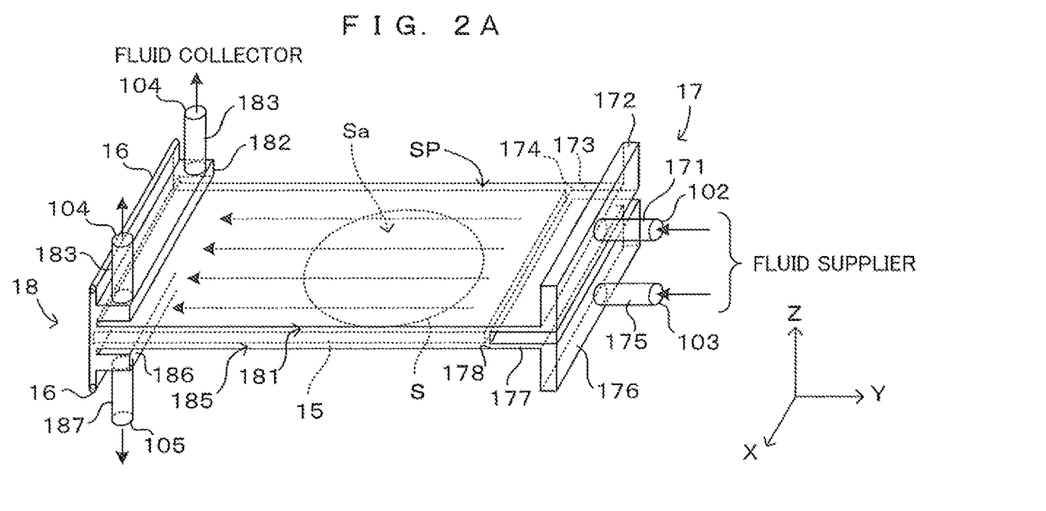
FIGS. 2A to 2C are views schematically showing flow passages of the processing fluid.
Figure 2B:
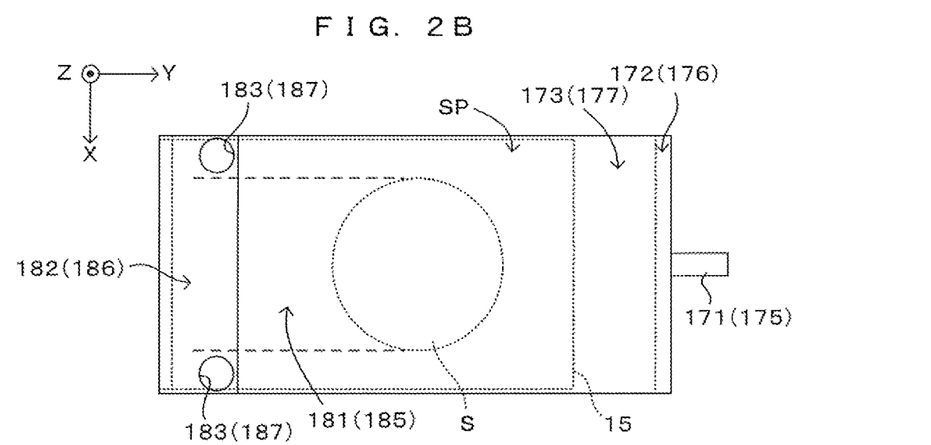
Figure 2C:
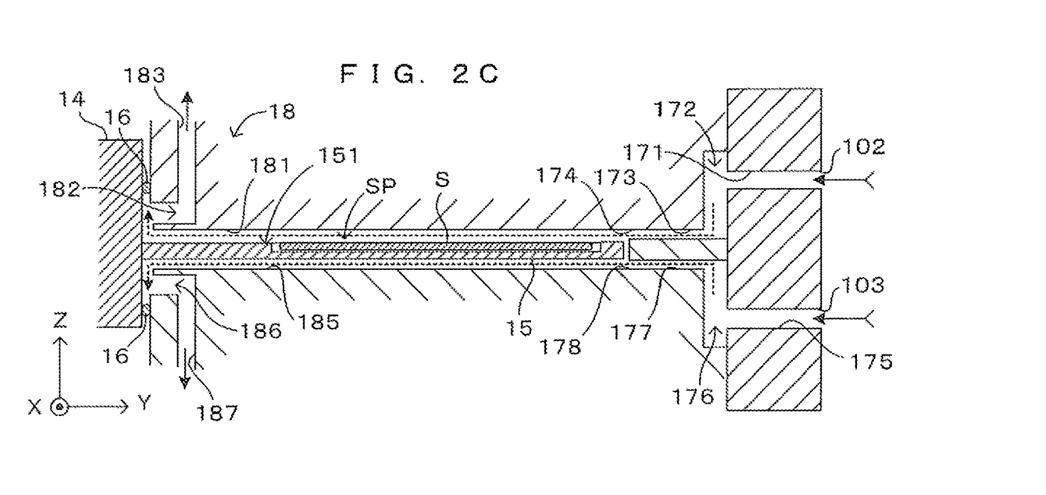

FIGS. 2A to 2C are views schematically showing flow passages of the processing fluid. More specifically, FIG. 2A is a schematic view showing the contours of the flow passages, FIG. 2B is a plan view of the flow passages, and FIG. 2C is a side sectional view of the flow passages. The structures of the flow passages of the processing fluid are described below with reference to FIGS. 1 and 2A to 2C.

A flow passage 17 extending from the input ports 102, 103 to the processing space SP functions as an introduction flow passage for introducing the processing fluid supplied from the fluid supplier 57 to the processing space SP. Specifically, a flow passage 171 is connected to the input port 102. A buffer space 172 formed to suddenly enlarge a flow passage cross-sectional area is provided on an end part of the flow passage 171 opposite to the input port 102.

A flow passage 173 is further provided to connect the buffer space 172 and the processing space SP. The flow passage 173 has such a wide cross-sectional shape narrow in a vertical direction (Z direction) and long in a horizontal direction (X direction), and that cross-sectional shape is substantially constant in a flowing direction of the processing fluid. An end part of the flow passage 173 opposite to the buffer space 172 serves as a discharge opening 174 open to the processing space SP, and the processing fluid is introduced into the processing space SP through this discharge opening 174.

Desirably, a height of the flow passage 173 is equal to a distance between the ceiling surface of the processing space SP and the substrate surface Sa with the support tray 15 accommodated in the processing space SP. The discharge opening 174 is open to a gap between the ceiling surface of the processing space SP and the upper surface 151 of the support tray 15. For example, the ceiling surface of the flow passage 173 and the ceiling surface of the processing space SP can be coplanar. As just described, the discharge opening 174 is in the form of a slit elongated in the horizontal direction and facing the processing space SP.

Flow passages of the processing fluid are also similarly formed below the support tray 15. Specifically, a flow passage 175 is connected to the input port 103. A buffer space 176 formed to suddenly enlarge a flow passage cross-sectional area is provided on an end part of the flow passage 175 opposite to the input port 103.

The buffer space 176 and the processing space SP communicate via a flow passage 177. The flow passage 177 has such a wide cross-sectional shape narrow in the vertical direction (Z direction) and long in the horizontal direction (X direction), and that cross-sectional shape is substantially constant in the flowing direction of the processing fluid. An end part of the flow passage 177 opposite to the buffer space 176 serves as a discharge opening 178 open to the processing space SP, and the processing fluid is introduced into the processing space SP through this discharge opening 178.

Desirably, a height of the flow passage 177 is equal to a distance between the bottom surface of the processing space SP and the lower surface of the substrate S. The discharge opening 178 is open to a gap between the bottom surface of the processing space SP and the lower surface of the support tray 15. For example, the bottom surface of the flow passage 177 and the bottom surface of the processing space SP can be coplanar. That is, the discharge opening 178 is in the form of a slit elongated in the horizontal direction and facing the processing space SP.

In the Z direction, the flow passages 171 and 173 are desirably arranged at different positions. If the both flow passages are at the same height, part of the processing fluid having entered the buffer space 172 from the flow passage 171 directly flows straight to enter the flow passage 173. Then, a flow rate and a flow velocity of the processing fluid flowing into the flow passage 173 may be different at a position corresponding to the flow passage 171 and at other positions in a width direction of the flow passage orthogonal to the flowing direction, i.e. in the X direction. This makes the flow of the processing fluid flowing into the processing space SP from the flow passage 173 nonuniform in the X direction and causes a turbulence.

By arranging the flow passages 171, 173 at positions different in the Z direction, the processing fluid does not flow straight from the flow passage 171 to the flow passage 173 and the processing fluid can be introduced as a laminar flow uniform in the width direction into the processing space SP.

The processing fluid introduced from the introduction flow passage 17 is configured as just described flows along the upper and lower surfaces of the support tray 15 in the processing space SP and is discharged to the outside of the chamber via a flow passage 18 configured as described below. The ceiling surface of the processing space SP and the upper surface 151 of the support tray 15 are both horizontal surfaces on a side closer to a (−Y) side than the substrate S, and the both surfaces are facing each other in parallel while keeping a constant gap. This gap functions as an upper flow passage 181 for introducing the processing fluid flowing along the upper surface 151 of the support tray 15 and the surface Sa of the substrate S into a discharge flow passage to be described later. That is, the upper flow passage 181 has such a wide cross-sectional shape narrow in the vertical direction (Z direction) and long in the horizontal direction (X direction).

An end part of the upper flow passage 181 opposite to the processing space SP is connected to a buffer space 182. A more detailed structure is described later. The buffer space 182 is a space surrounded by the chamber 100, the lid part 14 and the sealing member 16. A width of the buffer space 182 is equal to or larger than that of the upper flow passage 181 in the X direction, and a height of the buffer space 182 is larger than that of the upper flow passage 181 in the Z direction. Thus, the buffer space 182 has a larger flow passage cross-sectional area than the upper flow passage 181.

Discharge flow passages 183 are connected to an upper part of the buffer space 182. The discharge flow passages 183 are through holes provided through the first member 11, which is an upper block constituting the chamber 100. The upper ends of the discharge flow passages 183 constitute output ports 104 open in the upper surface of the chamber 100, and the lower ends thereof are open to the buffer space 182.

Similarly, the bottom surface of the processing space SP and the lower surface of the support tray 15 are both horizontal surfaces, and the both surfaces are facing each other in parallel while keeping a constant gap. This gap functions as a lower flow passage 185 for introducing the processing fluid flowing along the lower surface of the support tray 15 into the discharge flow passages. That is, the lower flow passage 185 has such a wide cross-sectional shape narrow in the vertical direction (Z direction) and long in the horizontal direction (X direction).

An end part of the lower flow passage 185 opposite to the processing space SP is connected to a buffer space 186. Similarly to the buffer space 182, the buffer space 186 is a space surrounded by the chamber 100, the lid part 14 and the sealing member 16. A width of the buffer space 186 is equal to or larger than that of the lower flow passage 185 in the X direction, and a height of the buffer space 186 is larger than that of the lower flow passage 185 in the Z direction. Thus, the buffer space 186 has a larger flow passage cross-sectional area than the lower flow passage 185.

Discharge flow passages 187 are connected to a lower part of the buffer space 186. The discharge flow passages 187 are through holes provided through the second member 12, which is a lower block constituting the chamber 100. The lower ends of the discharge flow passages 187 constitute output ports 105 open in the lower surface of the chamber 100, and the upper ends thereof are open to the buffer space 186.

The processing fluid flowing above the support tray 15 in the processing space SP is fed to the output ports 104 via the upper flow passage 181, the buffer space 182 and the discharge flow passages 183. The output ports 104 are connected to a fluid collector 55 by a piping 551, and a valve 552 is disposed at an intermediate position of the piping 551.

Similarly, the processing fluid flowing below the support tray 15 in the processing space SP is fed to the output ports 105 via the lower flow passage 185, the buffer space 186 and the discharge flow passages 187. The output ports 105 are connected to the fluid collector 55 by a piping 553, and a valve 554 is disposed at an intermediate position of the piping 553.

The valves 552, 554 are controlled by the control unit 90. If the valves 552, 554 are opened in response to a control command from the control unit 90, the processing fluid in the processing space SP is collected into the fluid collector 55 via the pipings 551, 553.

As shown in FIGS. 2A and 2C, the processing fluid fed under pressure from the fluid supplier 57 to the input ports 102 is released into the buffer space 172, which is a relatively large space, by way of the flow passage 171. Even if the fluid is supplied in the form of a liquid, the fluid possibly evaporates and expands in the flow passage due to a variation of pressure loss in the flow passage or the like. If such a sudden expansion occurs near the substrate S, the substrate S may be damaged.

To avoid this, a part where pressure loss largely varies is provided in a part of the flow passage 171 leading to the processing space SP, so that possible evaporation and expansion occur in this part. The buffer space 172 is provided as a space for this. Further, the buffer space 172 also has a function as a manifold for rectification to enable the fluid flowing in the pipe-like flow passage 171 to be supplied in the form of a thin layer to the processing space SP. Functions of the buffer space 176 are also similar.

The processing fluid supplied from the buffer space 172 to the processing space SP through the discharge opening 174 by way of the flow passage 173 having a constant flow passage cross-sectional area passes above the substrate surface Sa as a laminar flow keeping a constant width and a constant thickness as schematically shown by dotted-line arrows in FIG. 2A. Similarly, the processing fluid supplied from the buffer space 176 to the processing space SP through the discharge opening 178 by way of the flow passage 177 having a constant flow passage cross-sectional area flows along the lower surface of the support tray 15 as a laminar flow keeping a constant width and a constant thickness.

The processing fluid having passed around the substrate S flows further to a downstream side by way of the upper flow passage 181 and the lower flow passage 185. Since the flow passages keep substantially the same cross-sectional shapes also here, a laminar flow state is maintained. The processing fluid flowing in the upper and lower flow passages 181, 185 is discharged to the outside of the chamber by way of the discharge flow passages 183, 187 after being released into the buffer spaces 182, 186. In this way, the processing fluid flows in one direction, specifically in the (−Y) direction, in the processing space SP. Thus, the generation of a turbulence of the processing fluid around the substrate S is avoided.

If the processing space SP is viewed from the aperture 101, the processing fluid flows as a substantially uniform and continuous laminar flow from the (+Y) side (back side) toward the (−Y) side (front side) of the substrate S in the processing space SP as schematically shown by dotted-line arrows in FIG. 2C. The clean processing fluid is constantly supplied from the back side of the processing space SP, and the processing fluid having passed around the substrate S flows toward the downstream side, i.e. toward the aperture 101. Therefore, remaining liquid components and the like liberated from the substrate S are pushed to flow in one direction to the aperture 101 together with the processing fluid, whereby these components and the like are prevented from being carried by a turbulence around the substrate S and adhering to the substrate S again.

As shown in FIG. 2A, a pair of the discharge flow passages 183, 183 are provided near both end parts of the buffer space 182 elongated in the X direction. Openings of the discharge flow passages 183, 183 facing the buffer space 182 are desirably provided further outward than both end parts in the X direction of the substrate S accommodated in the processing space SP as shown in FIG. 2B. The reason for that is described in detail later.

Figure 3A:
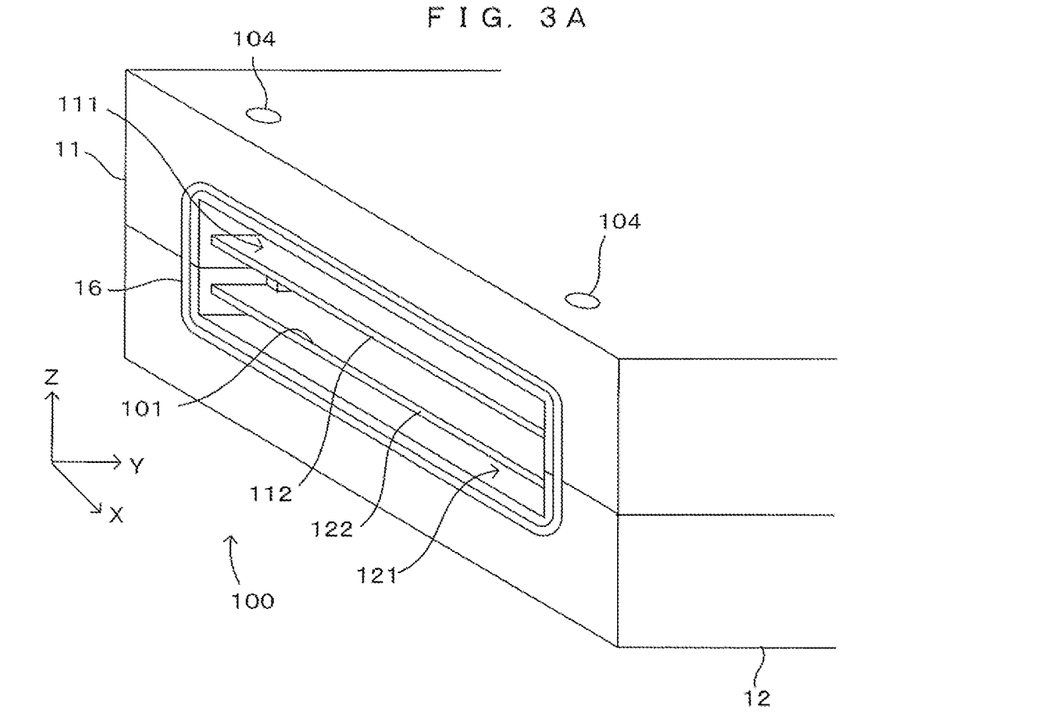
FIGS. 3A and 3B are views illustrating a structure around the aperture of the chamber.
Figure 3B:
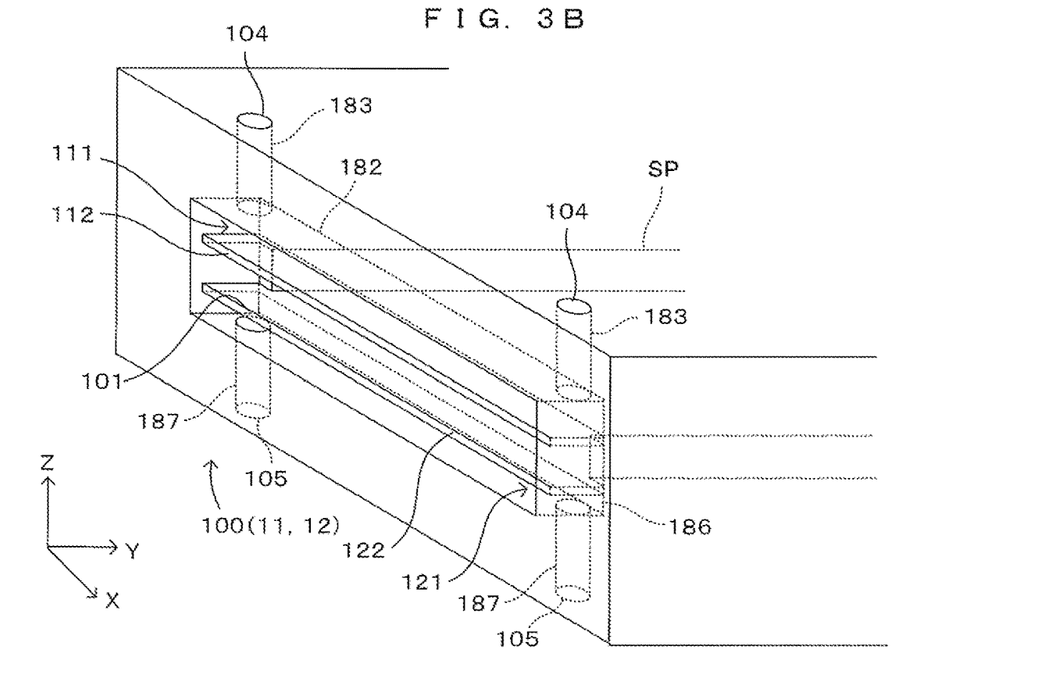

FIGS. 3A and 3B are views illustrating a structure around the aperture of the chamber. More specifically, FIG. 3A is an external view showing the aperture 101 of the chamber 100. Further, FIG. 3B is a view in which a boundary line between the sealing member 16 and the first and second members 11, 12 is omitted from FIG. 3A and a structure hidden in FIG. 3A is shown by hidden lines (dotted lines) instead to show the internal structure of the chamber 100 in an easy-to-see manner.

As shown in these figures, the annular sealing member 16 is attached to the (−Y) side surface of the chamber 100 and the aperture 101 is provided in an internal region surrounded by the sealing member 16. More specifically, the (−Y) side surfaces of the first and second members 11, 12 constituting the chamber 100 are recessed toward the (+Y) side to provide recesses 111, 112. A flange-like separation wall 112 having a width equal to or slightly larger than that of the processing space SP in the X direction and thin in the vertical direction (Z direction) is provided to project in the (−Y) direction on the lower end of the recess 111 of the first member 11. Further, a flange-like separation wall 122 having a width equal to or slightly larger than that of the processing space SP in the X direction and thin in the vertical direction (Z direction) is also provided to project in the (−Y) direction on the upper end of the recess 112 of the second member 12.

Tip parts of the separation walls 112, 122 on the (−Y) side and end surfaces of the recesses 111, 121 on the (−X) and (+X) sides form the aperture 101. The lower surface of the separation wall 112 is coplanar with the ceiling surface of the processing space SP, whereas the upper surface of the separation wall 122 is coplanar with the bottom surface of the processing space SP. That is, a space between the separation walls 112, 122 serves as a (−Y) side end part of the processing space SP communicating with the aperture 101. As just described, the separation wall 112 is a separation wall separating the inside of the recess 111 into the processing space SP and an upper space above and adjacent to the processing space SP, whereas the separation wall 122 is a separation wall separating the inside of the recess 121 into the processing space SP and a lower space below and adjacent to the processing space SP.

The upper space above the separation wall 112 forms the buffer space 182 by having an opening thereof on the (−Y) side closed by the lid part 14. Further, the lower space below the separation wall 122 forms the buffer space 186 by having an opening thereof on the (−Y) side closed by the lid part 14. The discharge flow passages 183, 183 are connected near both end parts in the X direction of the upper surface of the recess 111. The discharge flow passages 183, 183 communicate with the output ports 104, 104 provided in the upper surface of the first member 11. Further, the discharge flow passages 187, 187 are connected near both end parts in the X direction of the lower surface of the recess 121. The discharge flow passages 187, 187 communicate with the output ports 105, 105 provided in the lower surface of the second member 12.

Figure 4:
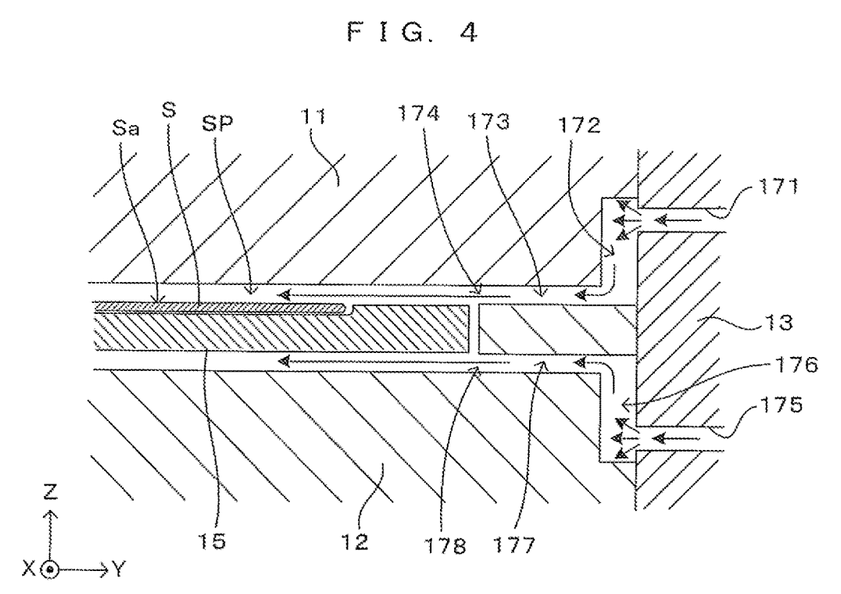
FIG. 4 is a sectional view schematically showing a flow of the processing fluid being introduced into the processing space.

FIG. 4 is a sectional view schematically showing a flow of the processing fluid being introduced into the processing space. The flow of the processing fluid above the substrate S is as follows. Arrows schematically show a direction of the flow of the processing fluid. The processing fluid fed under pressure to the flow passage 171 is introduced into the processing space SP through the discharge opening 174 by way of the flow passage 173 narrow in the vertical direction and wide in the horizontal direction after having the pressure thereof adjusted by being released into a wide space in the buffer space 172.

Since the flow passage 173 and the discharge opening 174 have substantially the same cross-sectional shape as a gap space between the ceiling surface of the processing space SP and the substrate S (support tray 15), the processing fluid flows from the flow passage 173 to the processing space SP while keeping the laminar flow state. Therefore, the processing fluid further flows toward the downstream side, i.e. the (+Y) side as a laminar flow along the substrate surface Sa. Also below the substrate S (support tray 15), the processing fluid fed under pressure to the flow passage 175 is introduced into the processing space SP through the discharge opening 178 by way of the buffer space 176 and the flow passage 177 and flows below the support tray 15 as a laminar flow.

Figure 5:
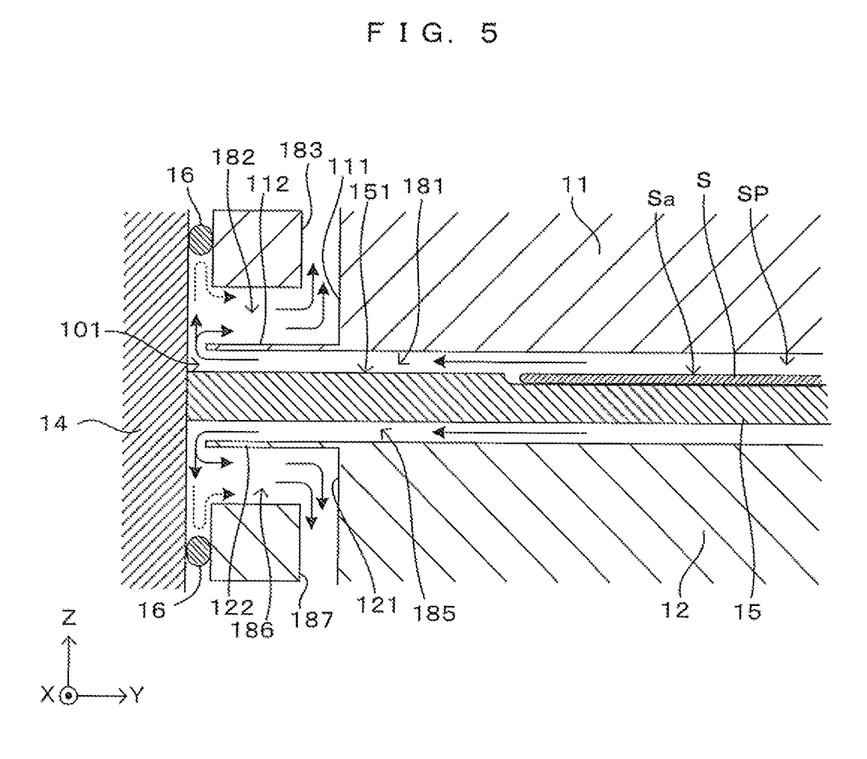
FIG. 5 is a sectional view schematically showing a flow of the processing fluid discharged from the processing space.

FIG. 5 is a sectional view schematically showing a flow of the processing fluid discharged from the processing space. The flow of the processing fluid above the substrate S is as follows. Arrows schematically show a direction of the flow of the processing fluid. In a state where the lid part 14 closes the aperture 101 and the support tray 15 having the substrate S placed thereon is accommodated in the processing space SP, the flowing direction of the processing fluid flowing in the (−Y) direction in the processing space SP is changed to the vertical direction by the lid part 14, and is finally discharged to the outside of the chamber by way of the buffer spaces 182, 186 and the discharge flow passages 183, 187.

The processing fluid flowing along the substrate surface Sa flows in the (−Y) direction in the upper flow passage 181 formed between the ceiling surface of the processing space SP and the support tray 15 while the laminar flow state is maintained. Then, the processing fluid comes into contact with the (+Y) side surface of the lid part 14 to change the flowing direction to an upward direction and flows into the buffer space 182. In the buffer space 182, the processing fluid flows in the (+Y) direction and is discharged to the outside via the discharge flow passages 183 connected to an upper part of the buffer space 182. That is, when the processing fluid flows into the buffer space 182 from the upper flow passage 181, the flowing direction of the processing fluid is reversed. Further, the direction of the flow passage is changed by 90° also between the buffer space 182 and the discharge flow passages 183.

As just described, the processing fluid having passed through the upper flow passage 181 is finally discharged to the outside of the chamber while the flowing direction thereof is changed. When the processing fluid flows into the buffer space 182 having a large flow passage cross-sectional area from the upper flow passage 181 having a small flow passage cross-sectional area, the pressure of the processing fluid is released and the processing fluid vigorously flows into the buffer space 182. Moreover, at this time, the flowing direction is changed and a flow passage resistance of the upper flow passage 181 viewed from the buffer space 182 increases. Thus, a swirl of the processing fluid is possibly generated in the buffer space 182, but the processing fluid does not flow back to the narrow upper flow passage 181 against the flow blowing out at a high pressure. As shown in FIG. 2A, the buffer space 182 is elongated in the X direction. Specifically, the width of the buffer space 182 is equal to or slightly larger than the width of the upper flow passage 181 in the X direction.

As shown in FIG. 5, the buffer space 182 is formed by closing an opening surface of the recess 111 provided in the (−Y) side end surface of the first member 11 constituting an upper part of the chamber 100 by the lid part 14. The buffer space 182 is a space surrounded by the first member 11, the lid part 14 and the sealing member 16, and the sealing member 16 is interposed in a clearance between the first member 11 and the lid part 14. Thus, the sealing member 16 is partially exposed to the buffer space 182, and the processing fluid filling up the buffer space 182 unavoidably contacts the sealing member 16. If the sealing member 16 is made of rubber, organic components may be dissolved and mixed as impurities into the processing fluid.

In the buffer space 182, such a flow is possibly generated in which part of the processing fluid flows into the clearance between the lid part 14 and the first member 11, contacts the sealing member 16 and returns to the buffer space 182 as shown by a dotted-line arrow. Since the flowing direction of the processing fluid is changed to the upward direction when the processing fluid flows into the buffer space 182 from the upper flow passage 181, such a flow as to rather actively feed the processing fluid toward the sealing member 16 is easily generated.

Accordingly, the impurities mixed from the sealing member 16 are separated from the sealing member 16 while being mixed into the processing fluid in the buffer space 182, and are discharged from the buffer space 182 together with the processing fluid. As just described, since the processing fluid including the impurities is less likely to be retained around the sealing member 16, a gradual increase of an impurity concentration is avoided. Further, the processing fluid in the buffer space 182 is discharged to the outside without flowing back to the upper flow passage 181. From these, it is effectively prevented that the impurities liberated from the sealing member 16 adhere to the substrate S in the processing space SP to contaminate the substrate S.

To effectively prevent a backflow of the processing fluid from the buffer space 182 to the upper flow passage 181, it is effective to suddenly change the flow passage cross-sectional area in a connecting part of the upper flow passage 181 and the buffer space 182. That is, the cross-sectional area and shape of the flow passage of the processing fluid are preferably as constant as possible until the processing fluid reaches the buffer space 182. To realize this, a gap between the separation walls 112, 122 and the lid part 14 with the aperture 101 closed by the lid part 14, i.e. a distance between the (−Y) side tip parts of the separation walls 112, 122 and the (+Y) side principal surface of the lid part 14, is desirably equal to the height of the upper flow passage 181, i.e. a distance between the ceiling surface of the processing space SP and the upper surface 151 of the support tray 15.

The same holds for the processing fluid flowing below the support tray 15. The processing fluid is released into the buffer space 186 from the lower flow passage 185 formed between the lower surface of the support tray 15 and the bottom surface of the processing space SP, whereby a backflow of the processing fluid to the lower flow passage 185 is prevented. The impurities liberated from the sealing member 16 and mixed into the buffer space 186 are discharged to the outside from the discharge flow passages 187 together with the processing fluid. From these, it is prevented that the impurities generated from the sealing member 16 enter the processing space SP to contaminate the substrate S.

The impurities to be mixed into the processing fluid possibly include impurities flying from outside when the substrate S is carried in and adhering to the aperture 101, the lid part 14 and the like, besides those generated from the sealing member 16. This embodiment is also effective for such a problem of contaminating the substrate S by impurities. This is for the following reason. Since the processing fluid is supplied from the side further backward than the substrate S when viewed from the aperture 101 and the processing fluid is restricted to flow in one direction toward the front side in the processing space SP, even if impurities are mixed into the processing fluid around the aperture 101, it is prevented that those impurities flow back to the processing space SP and adhere to the substrate S.

As shown in FIGS. 2A and 3B, the discharge flow passages 183 (187) for discharging the processing fluid from the buffer space 182 (186) are connected to the both end parts in the X direction of the buffer space 182 (186). The reason for this is described with reference to FIGS. 6A and 6B.

Figure 6A:
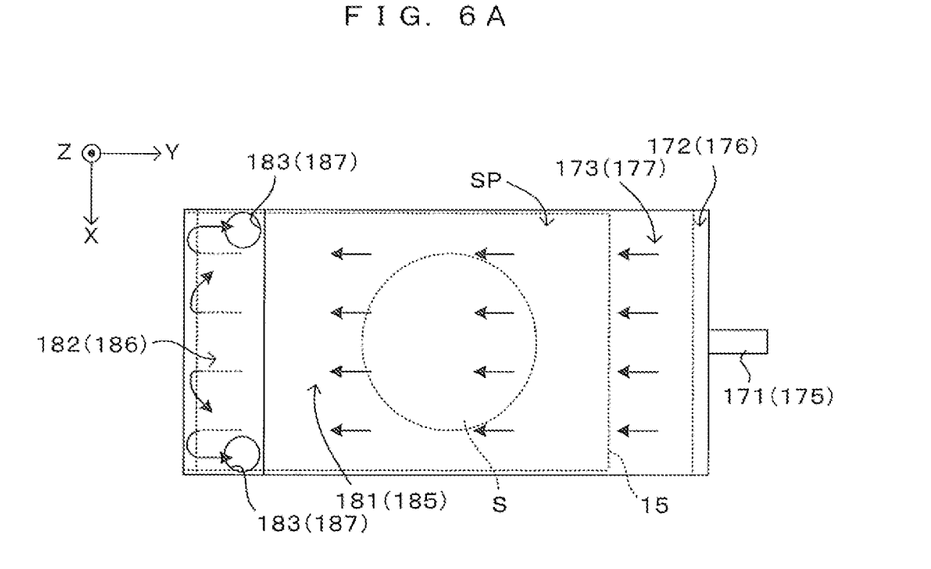
FIGS. 6A and 6B are views schematically showing a relationship of the positions of the discharge flow passages and the flow of the processing fluid.
Figure 6B:
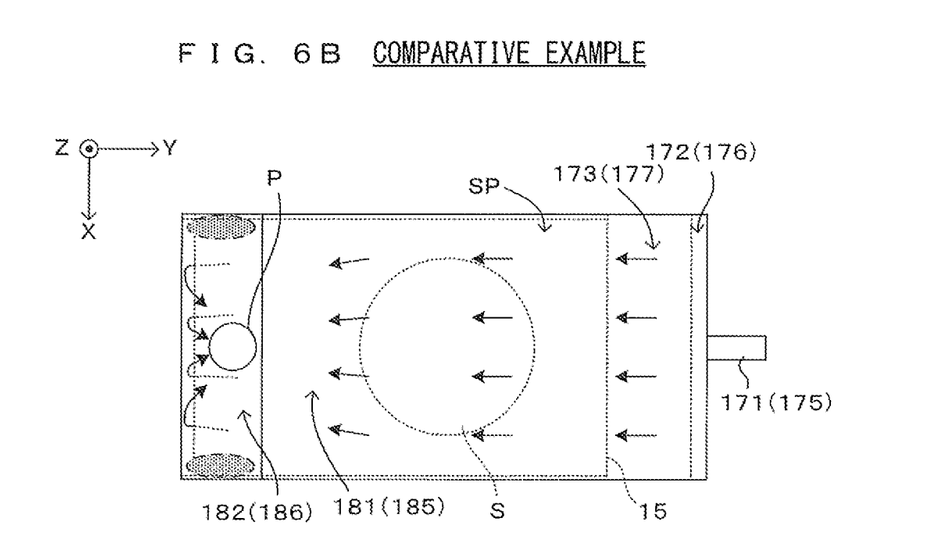

FIGS. 6A and 6B are views schematically showing a relationship of the positions of the discharge flow passages and the flow of the processing fluid. The inventors of this application acquired the following knowledge by conducting a simulation experiment of analyzing the flow of the processing fluid by variously differentiating the connected positions of the discharge flow passages 183 (187) to the buffer space 182 (186). Note that, in terms of forming a uniform laminar flow in the processing space SP, it is premised that the arrangement of the discharge flow passages is symmetric in the X direction (i.e. with respect to a YZ plane).

As shown by arrows in FIG. 6A, the processing fluid flows as a uniform laminar flow in the (−Y) direction in the processing space SP and flows into the discharge flow passages 183 (187) by way of the buffer space 182 (186) from the flow passage 181 (185). When the discharge flow passages 183 (187) are connected to the both end parts in the X direction of the buffer space 182 (186), the flow of the processing fluid in the buffer space 182 (186) is dispersed on both sides in the X direction. Thus, the processing fluid maintains a substantially uniform flow in the X direction at least until flowing into the buffer space 182 (186) from the flow passage 181 (185).

On the other hand, if a discharge flow passage is arranged on a more central side, for example, like a discharge flow passage P shown in FIG. 6B as a comparative example, the flow of the processing fluid toward the discharge flow passage P by way of the buffer space 182 (186) concentrates in a central part. Due to this, the flow of the processing fluid toward the central side is also generated in the flow passage 181 (185). This possibly causes a turbulence in the processing space SP.

Further, due to the concentration of the processing fluid in a central direction, the processing fluid is retained near the both end parts in the X direction of the buffer space 182 (186) shown by shading in FIG. 6B. As described above, the processing fluid in the buffer space 182 (186) possibly includes impurities liberated from the substrate S and/or the sealing member 16. The retention of the processing fluid including such impurities and a disturbance of the laminar flow in the processing space SP cause an increased risk that the impurities adhere to the substrate S to contaminate the substrate S. Even if the discharge flow passages P are arranged at a plurality of positions to disperse the flow, a similar risk remains in disturbing the laminar flow if the discharge flow passages P are arranged to form such a flow of the processing fluid toward the central side.

Such a problem is solved by arranging the discharge flow passages 183 (187) near the both end parts of the buffer space 182 (186). It is particularly effective that the discharge flow passages 183 (187) are open on sides further outward in the X direction than the end part in the X direction of the substrate S in the processing space SP as shown in FIG. 2B. By doing so, a turbulence of the processing fluid flowing along the substrate S is avoided, and the adhesion of the impurities carried by the turbulence can also be effectively prevented.

Note that it has been thus far described that the separation wall 112 (122) separating the processing space SP and the buffer space 182 (184) is integrally formed to the first member 11 (second member 12) constituting the processing chamber 100. More realistically, the separation walls can be provided to have the following structure.

Figure 7A:
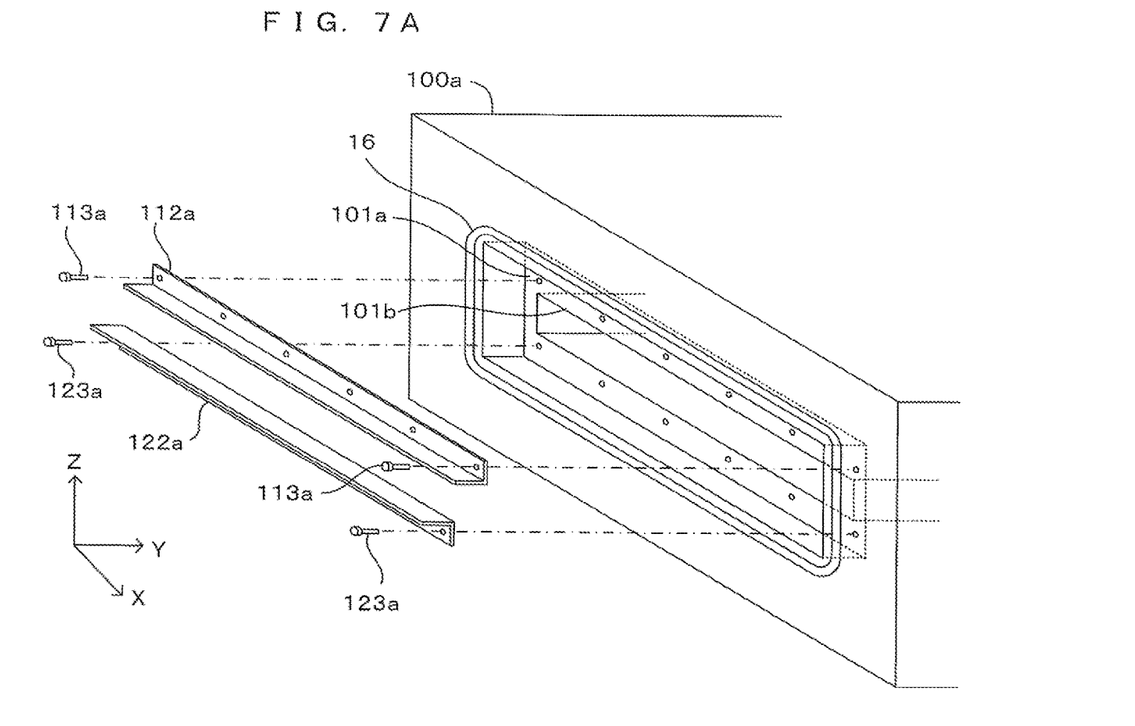
FIGS. 7A and 7B are views illustrating another structure around the aperture of the processing chamber.
Figure 7B:
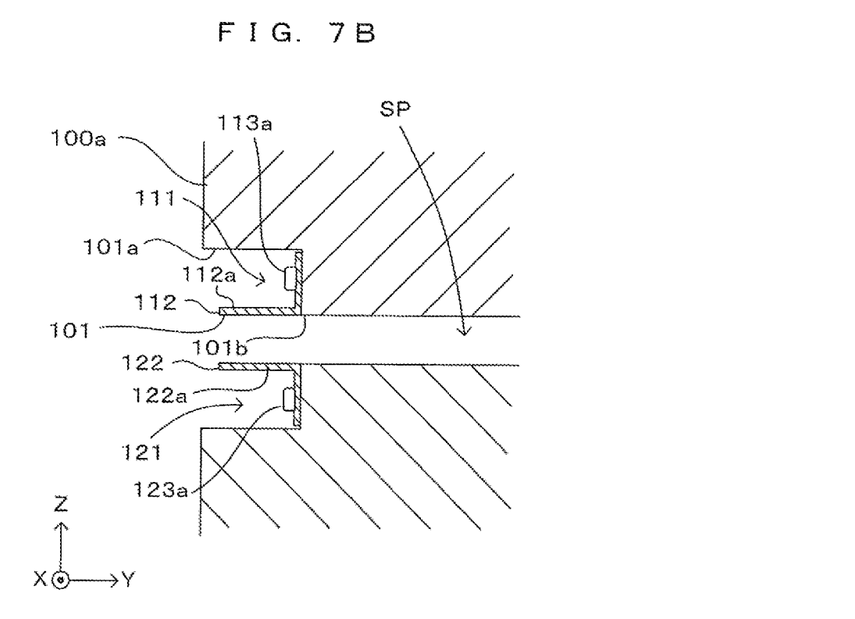

FIGS. 7A and 7B are views illustrating another structure around the aperture of the processing chamber. More specifically, FIG. 7A is an exploded view showing the periphery of an aperture of a processing chamber 100a of this example, and FIG. 7B is a view showing a cross-sectional structure around the aperture. Note that, in FIGS. 7A and 7B and the description thereof, structural elements having functions substantially similar to those shown in FIG. 3A are denoted by the same reference signs and are not described in detail.

In this processing chamber 100a, a (−Y) side surface is recessed toward the (+Y) side to form a recess 101a. An opening 101b communicating the processing space SP is provided in a central part of the recess 101a. A separation wall forming member 112a, which is an angled member formed separately from the chamber 100a and having a substantially L-shaped cross-section is fixed to an upper part of the opening 101b by fixing screws 13a. Similarly, a separation wall forming member 122a is fixed to a lower part of the opening 101b by fixing screws 123a.

Also by such a structure, a structure in which the aperture 101 communicating with the processing space SP and the recesses 111, 121 provided above and below the aperture 101 are separated by the separation walls 112, 122 can be realized as shown in FIG. 7B.

As described above, in this embodiment, the processing chamber 100 mainly composed of the first to third members 11 to 13 functions as a "chamber body" of the invention, and the processing chamber 100 and the lid part 14 are combined to constitute a "chamber" of the invention. Further, the support tray 15 functions as a "substrate holder" of the invention, and the aperture 101 corresponds to an "aperture" of the invention. Further, the flow passage 17 corresponds to an "introduction flow passage" of the invention, and the buffer spaces 172, 176 correspond to an "enlarged space" of the invention.

Note that the invention is not limited to the embodiment described above and various changes other than the aforementioned ones can be made without departing from the gist of the invention. For example, in the substrate processing apparatus 1 of the above embodiment, the introduction flow passage, the buffer space and the discharge flow passages according to the invention are provided to correspond to each of the sides above and below the support tray 15, out of the processing space. However, in the sense of preventing the adhesion of impurities to the substrate caused by a turbulence, it is sufficient to apply the invention at least to the flow passage of the processing fluid passing above the substrate. In this sense, the flow passage of the processing fluid flowing below the support tray 15 is not limited to the above configuration. However, since the flows above and below the support tray 15 are not physically completely separated, such a flow passage configuration as to maintain laminar flows on both sides above and below the support tray 15 as in the above embodiment is most preferable.

Further, in the above embodiment, the buffer spaces 182, 186 are formed by the lid part 14 closing the recesses 111, 121 provided in the side surface of the processing chamber 100 (via the sealing member 16). However, these recesses may be provided in the lid part 14.

Further, various chemical substances used in the process of the above embodiment are some of examples and various other ones can be used instead of these if those conform to the technical concept of the invention described above.

As the specific embodiment has been illustrated and described above, the substrate processing apparatus according to the invention may be so configured that an introduction flow passage, a buffer space and discharge flow passages are provided to correspond to a gap space formed in a clearance between a ceiling surface, out of wall surfaces of a processing space, and an upper surface of a substrate holder and an introduction flow passage, a buffer space and discharge flow passages are provided to correspond to a gap space formed in a clearance between a bottom surface, out of the wall surfaces of the processing space, and a lower surface of the substrate holder. In terms of preventing the contamination of the substrate surface, the technical concept of the invention may be applied at least to the flow passage of the processing fluid passing above the substrate. However, by adopting a similar flow passage configuration also for the processing fluid flowing on the lower surface side of the substrate holder, an effect of preventing contamination due to a turbulence can be further enhanced.

For example, the openings to which the discharge flow passages are connected may be open on sides outward of both end parts in a width direction of the substrate in a plan view. According to such a configuration, a laminar flow state can be maintained without causing a flow toward a widthwise central side at least for the processing fluid passing above the substrate.

For example, the one end part may be an end part on a side opposite to the aperture, out of both end parts of the processing space in the flowing direction, when viewed from the substrate, and the other end part may be an end part on the aperture side, out of the both end parts, when viewed from the aperture. According to such a configuration, the processing fluid flows in one direction from the processing space on a side backward of the substrate when viewed from the aperture toward a front side. Around the aperture of the chamber needed to be opened and closed every time the substrate is taken in or out, impurities generated, for example, from the sealing member and the like for keeping airtightness or impurities mixed from outside are unavoidable. By causing the processing fluid to flow from the side backward of the substrate toward the aperture side and suppressing the generation of a turbulence, the adhesion of such impurities to the substrate can be prevented.

For example, if the chamber includes a chamber body provided with a hollow serving as the processing space and a lid part for closing the aperture via the sealing member, the buffer space may be a space surrounded by the lid part, the chamber and the sealing member. In the structure for closing the aperture via the sealing member, it is unavoidable that a part of the sealing member is exposed to the flow passage and contacts the processing fluid. If the sealing member is exposed in the buffer space on a side downstream of the processing space and a laminar flow is maintained in the processing space, the adhesion of impurities to the substrate is avoided even if the impurities are mixed into the processing fluid from the sealing member.

For example, the flowing direction of the processing fluid may be changed by 90 degree or more in a connecting part of the gap space and the buffer space. According to such a configuration, a flow passage resistance of the flow passage on the upstream side when viewed from the buffer space increases, wherefore a backflow preventing effect from the buffer space to the processing space can be enhanced.

For example, an enlarged space having a larger flow passage cross-sectional area than an upstream side in the flowing direction may be provided at an intermediate position of the introduction flow passage, and the flowing direction may be changed by 90 degree or more in a flow passage from the enlarged space to the discharge opening. According to such a configuration, the processing fluid flowing in from outside can be supplied to the processing space after being temporarily stored and rectified in the enlarged space.

In this case, the introduction flow passage on a side downstream of the enlarged space in the flowing direction may have a constant cross-sectional shape up to the discharge opening. According to such a configuration, since the cross-section shape of the flow passage is the same over a certain length before the processing fluid is introduced into the processing space, the laminar flow when being introduced into the processing space can be more rectified.

Further, a length of the enlarged space in the width direction may be equal to or larger than a length of the introduction flow passage on the side downstream of the enlarged space in the flowing direction. If the width of the flow passage on the side downstream of the enlarged space is larger than that of the enlarged space, the processing fluid flowing in this flow passage has motion components in a direction spreading in the horizontal direction. Having direction components different from the flow direction in this way causes a turbulence. By maintaining or narrowing the flow passage width when the processing fluid flows into the flow passage on the downstream side from the enlarged space, this problem can be avoided.

In these cases, an opening position where the introduction flow passage on a side upstream of the enlarged space in the flowing direction faces the enlarged space and an opening position where the introduction flow passage on the downstream side faces the enlarged space preferably do not overlap each other in a vertical direction. If these opening positions overlap, part of the processing fluid flowing into the enlarged space directly flows straight and flows into the flow passage on the downstream side. Then, in the flow passage on the downstream side, at least one of an inflow amount and a flow velocity of the processing fluid is different at the position where the flow passage on the upstream side is open and other positions, and such a nonuniformity causes a turbulence. By preventing the opening positions from overlapping, such a straight flow of the processing fluid is eliminated and a more uniform laminar flow can be created.

This invention can be applied to substrate processing apparatuses in general for processing a substrate using a processing fluid introduced into a chamber. Particularly, the invention can be applied to a process using a high-pressure fluid, e.g. a substrate drying process of drying a substrate such as a semiconductor substrate by a supercritical fluid.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus for processing a surface of a substrate by a processing fluid, comprising:
a substrate holder in the form of a flat plate, the substrate being placeable in a horizontal posture on an upper surface of the substrate holder, that is opposite to a lower surface of the substrate holder; and
a chamber including a processing space capable of accommodating the substrate holder having the substrate placed thereon and a side surface having an aperture that communicates with the processing space and allows the substrate holder to pass through, the chamber having a ceiling surface spaced from the upper surface of the substrate holder to define an upper flow passage, and a bottom surface spaced from the lower surface of the substrate holder to define a lower flow passage;
wherein
the chamber is provided with a first introduction flow passage, a first discharge opening, a second introduction flow passage, a second discharge opening, a buffer space communicating with the processing space, and discharge flow passages configured to discharge the processing fluid from the buffer space to the outside of the chamber,
the first introduction flow passage is connected to the first discharge opening to feed the processing fluid not only in the horizontal direction but concentratedly to the upper flow passage between the ceiling surface of the chamber and the upper surface of the substrate holder,
the second introduction flow passage is connected to the second discharge opening to feed the processing fluid not only in the horizontal direction but concentratedly to the lower flow passage between the bottom surface of the chamber and the lower surface of the substrate holder,
the introduction flow passage is connected to a discharge opening open to a gap space formed in a clearance between a wall surface of the processing space and the substrate holder in one end part of the processing space in a plan view,
a shape of the discharge opening and a cross-sectional shape of a flow passage leading to the discharge opening are substantially the same as a cross-sectional shape of the gap space,
the buffer space is connected to the processing space at another end part opposite to the one end part across the substrate in a plan view and has a width substantially equal to that of the gap space in a width direction orthogonal to a flowing direction of the processing fluid flowing from the one end part toward the other end part, and
the discharge flow passages are respectively connected to a pair of openings provided in both end parts in the width direction of the buffer space.

2. The substrate processing apparatus according to claim 1, wherein
the introduction flow passage, the buffer space and the discharge flow passages are provided to correspond to the gap space formed in a clearance between a ceiling surface, out of wall surfaces of the processing space, and an upper surface of the substrate holder, and
the introduction flow passage, the buffer space and the discharge flow passages are provided to correspond to the gap space formed in a clearance between a bottom surface, out of the wall surfaces of the processing space, and a lower surface of the substrate holder.

3. The substrate processing apparatus according to claim 1, wherein the openings to which the discharge flow passages are connected are open on sides outward of both end parts in the width direction of the substrate in a plan view.

4. The substrate processing apparatus according to claim 1, wherein
the one end part is an end part on a side opposite to the aperture, out of both end parts of the processing space in the flowing direction, when viewed from the substrate, and
the other end part is an end part on the aperture side, out of the both end parts, when viewed from the aperture.

5. The substrate processing apparatus according to claim 1, wherein
the chamber includes a chamber body provided with a hollow serving as the processing space and a lid part configured to close the aperture via a sealing member, and
the buffer space is a space surrounded by the lid part, the chamber and the sealing member.

6. The substrate processing apparatus according to claim 1, wherein the flowing direction of the processing fluid is changed by 90 degree or more in a connecting part of the gap space and the buffer space.

7. The substrate processing apparatus according to claim 1, wherein
an enlarged space having a larger flow passage cross-sectional area than an upstream side in the flowing direction is provided at an intermediate position of the introduction flow passage, and
the flowing direction is changed by 90 degree or more in a flow passage from the enlarged space to the discharge opening.

8. The substrate processing apparatus according to claim 7, wherein the introduction flow passage on a side downstream of the enlarged space in the flowing direction has a constant cross-sectional shape up to the discharge opening.

9. The substrate processing apparatus according to claim 7, wherein a length of the enlarged space in the width direction is equal to or larger than a length of the introduction flow passage on the side downstream of the enlarged space in the flowing direction.

10. The substrate processing apparatus according to claim 7, wherein an opening position where the introduction flow passage on a side upstream of the enlarged space in the flowing direction faces the enlarged space and an opening position where the introduction flow passage on the side downstream of the enlarged space in the flowing direction faces the enlarged space do not overlap each other in a vertical direction.

11. The substrate processing apparatus according to claim 1, further comprising a first supply passage that supplies processing fluid to the first introduction flow passage, and a second supply passage that supplies processing fluid to the second introduction flow passage.

12. A substrate processing apparatus for processing a surface of a substrate by a processing fluid, comprising:
a substrate holder in the form of a flat plate, the substrate being placeable in a horizontal posture on an upper surface of the substrate holder; and
a chamber including a processing space capable of accommodating the substrate holder having the substrate placed thereon and a side surface having an aperture that communicates with the processing space and allows the substrate holder to pass through,
wherein
the chamber is provided with an introduction flow passage communicating with the processing space so as to receive the processing fluid supplied from outside the chamber, a buffer space communicating with the processing space and discharge flow passages configured to discharge the processing fluid from the buffer space to the outside of the chamber,
the introduction flow passage is connected to a discharge opening open to a gap space formed in a clearance between a wall surface of the processing space and the substrate holder in one end part of the processing space in a plan view,
a shape of the discharge opening and a cross-sectional shape of a flow passage leading to the discharge opening are substantially the same as a cross-sectional shape of the gap space,
the buffer space is connected to the processing space at another end part opposite to the one end part across the substrate in a plan view and has a width substantially equal to that of the gap space in a width direction orthogonal to a flowing direction of the processing fluid flowing from the one end part toward the other end part,
the discharge flow passages are respectively connected to a pair of openings provided in both end parts in the width direction of the buffer space,
the chamber includes a chamber body provided with a hollow serving as the processing space and a lid part configured to close the aperture via a sealing member,
the buffer space is a space surrounded by the lid part, the chamber and the sealing member, and
the flowing direction of the processing fluid is changed by 90 degree or more in a connecting part of the gap space and the buffer space.

13. The substrate processing apparatus of claim 12, wherein the buffer space has a larger flow passage cross-sectional area than the upper flow passage.

14. A substrate processing apparatus for processing a surface of a substrate by a processing fluid, comprising:
a substrate holder in the form of a flat plate, the substrate being placeable in a horizontal posture on an upper surface of the substrate holder; and
a chamber including a processing space capable of accommodating the substrate holder having the substrate placed thereon and a side surface having an aperture that communicates with the processing space and allows the substrate holder to pass through,
wherein
the chamber is provided with an introduction flow passage communicating with the processing space so as to receive the processing fluid supplied from outside the chamber, a buffer space communicating with the processing space and discharge flow passages configured to discharge the processing fluid from the buffer space to the outside of the chamber,
the introduction flow passage is connected to a discharge opening open to a gap space formed in a clearance between a wall surface of the processing space and the substrate holder in one end part of the processing space in a plan view, a shape of the discharge opening and a cross-sectional shape of a flow passage leading to the discharge opening are substantially the same as a cross-sectional shape of the gap space, the buffer space is connected to the processing space at another end part opposite to the one end part across the substrate in a plan view and has a width substantially equal to that of the gap space in a width direction orthogonal to a flowing direction of the processing fluid flowing from the one end part toward the other end part, the discharge flow passages are respectively connected to a pair of openings provided in both end parts in the width direction of the buffer space, the chamber includes a chamber body provided with a hollow serving as the processing space and a lid part configured to close the aperture via a sealing member, a separation wall is provided to extend from the chamber body, and the buffer space is a space surrounded by the lid part, the chamber, the sealing member, and the separation wall.

* * * * *